United States Patent [19]

Kunieda et al.

[11] Patent Number: 4,896,056
[45] Date of Patent: Jan. 23, 1990

[54] SEMICONDUCTOR IC INCLUDING CIRCUIT FOR PREVENTING ERRONEOUS OPERATION CAUSED BY POWER SOURCE NOISE

[75] Inventors: Mitsuyuki Kunieda, Kawasaki; Tadahiro Fujii, Tokyo, both of Japan

[73] Assignee: Kabushiki Kaisha Toshiba, Kawasaki, Japan

[21] Appl. No.: 253,658

[22] Filed: Oct. 5, 1988

[30] Foreign Application Priority Data

Oct. 9, 1987 [JP] Japan ................. 62-254993

[51] Int. Cl.4 ............... H03K 17/16; H03K 5/00
[52] U.S. Cl. .................... 307/443; 307/475; 307/542; 307/572
[58] Field of Search ......... 307/443, 296.1, 296.4, 307/475, 480, 542, 572

[56] References Cited

U.S. PATENT DOCUMENTS

| 4,337,523 | 6/1982 | Hotta et al. | 365/194 |
|---|---|---|---|
| 4,584,491 | 4/1986 | Ulmer | 307/443 |
| 4,672,243 | 6/1987 | Kirsch | 307/443 |
| 4,707,623 | 11/1987 | Bismarck | 307/443 |
| 4,727,271 | 2/1988 | Favata et al. | 307/542 |
| 4,791,323 | 12/1988 | Austin | 307/443 |
| 4,839,583 | 6/1989 | Curtis | 307/443 |

FOREIGN PATENT DOCUMENTS

| 0167275 | 1/1986 | European Pat. Off. |
| 0181177 | 5/1986 | European Pat. Off. |
| 0212945 | 3/1987 | European Pat. Off. |

Primary Examiner—Stanley D. Miller
Assistant Examiner—Richard Roseen
Attorney, Agent, or Firm—Finnegan, Henderson, Farabow, Garrett and Dunner

[57] ABSTRACT

A semiconductor IC includes a first logic circuit, having a first threshold voltage, for outputting a logic signal corresponding to a level of an input signal which is externally supplied thereto, and an internal circuit for receiving a logic signal from the first logic circuit and executing a predetermined operation. The semiconductor IC further includes a second logic circuit, formed between the first logic circuit and the internal circuit, and having a second threshold voltage higher than the first threshold voltage, one input terminal thereof being connected to an output terminal of the first logic circuit, and the other input terminal receiving a control signal. The control signal is generated while power source noise caused by an operation of the internal circuit is being generated. While the control signal is being generated, a signal of a predetermined logic level is supplied from the second logic circuit to the internal circuit, regardless of an output signal level from the first logic circuit.

14 Claims, 4 Drawing Sheets

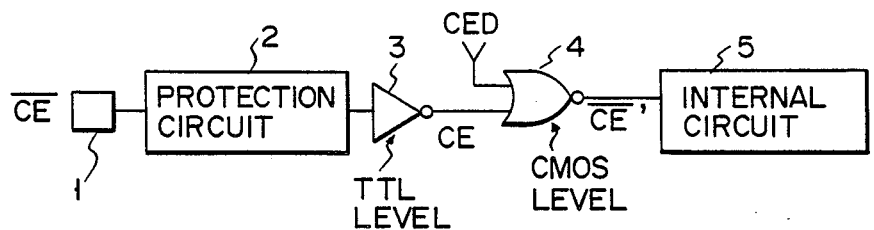
F I G. 1
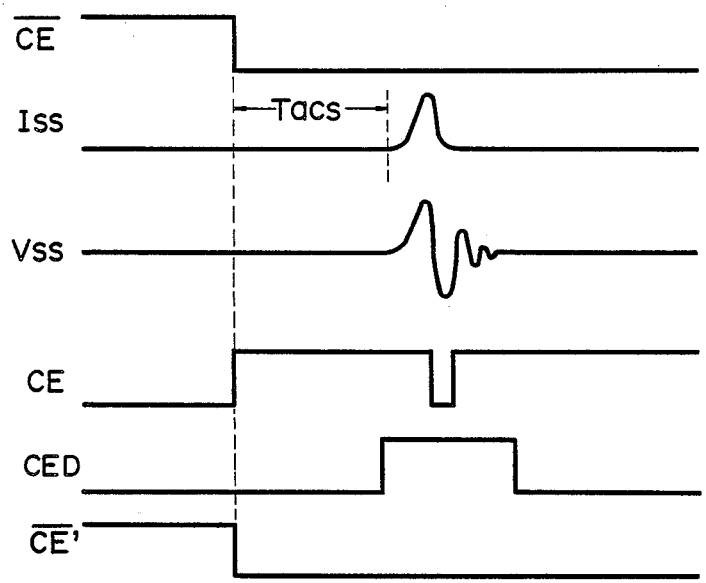
F I G. 2
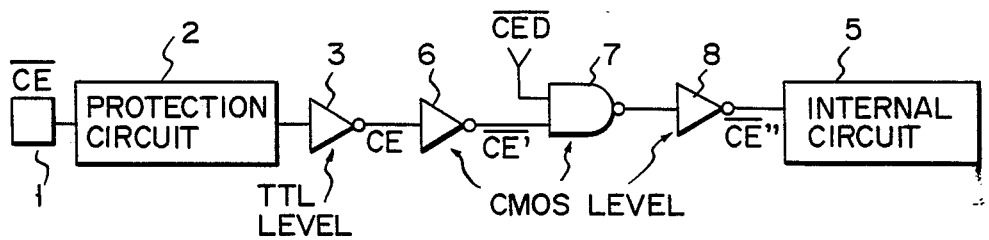
F I G. 3

SEMICONDUCTOR IC INCLUDING CIRCUIT FOR PREVENTING ERRONEOUS OPERATION CAUSED BY POWER SOURCE NOISE

BACKGROUND OF THE INVENTION

1. Field of the Invention

The present invention relates to a semiconductor IC and, more particularly, to a semiconductor IC including an input circuit in which a low threshold voltage is set.

2. Description of the Related Art

Generally, in a semiconductor IC, two standards of a TTL level and a CMOS level are often used as references of a signal level. In these standards, low level voltage $V_{IL}$ and high level voltage $V_{IH}$ to be satisfied by a pulse signal are defined as follows.

|  | $V_{IL}$ | $V_{IH}$ |
|---|---|---|
| TTL level | 0.8 V | 2.0 V |
| CMOS level | $V_{DD} \times 0.3$ | $V_{DD} \times 0.7$ |

In the above Table, $V_{DD}$ is a power source voltage. For example, assuming that $V_{DD} = 5V$, $V_{IL}$ and $V_{IH}$ at the CMOS level are 1.5 V and 3.5 V, respectively. That is, at the TTL level, a low level voltage (pulse base amplitude) of a pulse signal must be 0.8 V or less, and its high level voltage (pulse top amplitude) must be 2.0 V or more. At the CMOS level, when a power source voltage is 5 V, the low level voltage of a pulse signal must be 1.5 V or less, and its high level voltage must be 3.5 V or more. That is, a pulse signal of a TTL level has a lower DC level and a smaller amplitude than those of a pulse signal of a CMOS level. For this reason, a signal of a TTL level has a smaller noise margin than that of a signal of a CMOS level. Therefore, a logic circuit which receives a signal of a TTL level is more easily affected, in an adverse manner, by noise than a logic circuit which receives a signal of a CMOS level.

In a semiconductor IC having a CMOS arrangement, all signals transmitted inside a chip are at the CMOS level. However, an external input signal is not always at the CMOS level, but is often input at the TTL level. For this reason, a threshold voltage of an input circuit which receives an external input signal is set to be low so that logic "0" and "1" are correctly determined in accordance with a signal of a TTL level. Therefore, in a semiconductor IC having the CMOS arrangement, it is likely that an erroneous operation of an input circuit will occur. For this reason, in a semiconductor IC such as a memory of multi-bit output in which power source noise is easily generated, the problem of an input circuit erroneously operating in response to the power source noise, is posed.

Power source noise of a semiconductor IC is generated as a result of its circuit operation. For example, when "0" level outputs are output from all output buffers in a memory of multi-bits, a considerably large current instantaneously flows through a ground line because the ground line having a parasitic resistance and a parasitic inductance. As a result, a potential of the ground line varies around 0 V. Since a threshold voltage of an input circuit varies in accordance with a power source voltage, the threshold voltage of the input circuit is reduced when the potential of the ground line is reduced below 0 V. Therefore, even if an input voltage externally supplied to the input circuit satisfies logic "0", the threshold voltage of the input circuit may sometimes be lower than the input voltage. In this case, the input circuit erroneously operates as if an input voltage of logic "1" had been supplied thereto.

SUMMARY OF THE INVENTION

It is, therefore, an object of the present invention to provide a semiconductor IC which can correctly operate without being adversely affected by the possible generation of power source noise.

According to the present invention, there is provided a semiconductor integrated circuit comprising: a first logic circuit, having a first threshold voltage, for outputting a logic signal corresponding to a level of an input signal which is externally supplied thereto; a second logic circuit for outputting a logic signal of a predetermined level regardless of an output from the first logic circuit while a control signal is being generated, the second logic circuit having a second threshold voltage higher than the first threshold voltage, one input terminal for receiving an output signal from the first logic circuit, and another input terminal for receiving a control signal; an internal circuit for receiving the logic signal from the second logic circuit and executing a predetermined operation; and control signal generating means for generating the control signal while power source noise caused by the operation of the internal circuit is generated.

In the above semiconductor IC, even if power source noise is generated upon operation of the internal circuit, the control signal can be effectively generated while the noise is generated. Therefore, the second logic gate can generate a signal of a predetermined level without it being adversely affected by an output from the first logic gate. Therefore since an erroneous signal is not transmitted to the internal circuit, even in the case where the power source noise is generated, the internal circuit can more effectively operate without erroneously functioning. As a result, a highly reliable semiconductor IC can be obtained.

BRIEF DESCRIPTION OF THE DRAWINGS

FIG. 1 is a circuit diagram showing a semiconductor IC according to a first embodiment of the present invention;

FIG. 2 is a timing chart for explaining an operation of the semiconductor IC shown in FIG. 1;

FIG. 3 is a circuit diagram showing a semiconductor IC according to a second embodiment of the present invention;

DETAILED DESCRIPTION OF THE PREFERRED EMBODIMENTS

Figure 4:
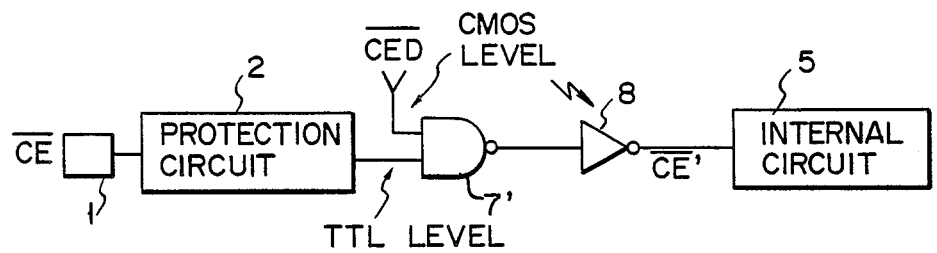
FIG. 4 is a circuit diagram showing a semiconductor IC according to a third embodiment of the present invention.

Embodiments of the present invention will be described in detail below with reference to the accompanying drawings.

FIG. 1 shows a semiconductor IC according to a first embodiment of the present invention, and FIG. 2 is a timing chart for explaining an operation of the semiconductor IC shown in FIG. 1. This semiconductor IC has input terminal 1 for receiving an external input signal, e.g., chip enable signal $\overline{CE}$ Terminal 1 is connected to protection circuit 2. Circuit 2 protects an internal element (inverter 3 in FIG. 1) against static electricity or an overvoltage applied to terminal 1, and has a clamp function for keeping a voltage at terminal 1 below a predetermined voltage. An output signal from circuit 2 is supplied to the input terminal of inverter 3. A threshold voltage of inverter 3 is set to be low so that logic "0" and "1" are correctly determined in accordance with an input signal of a TTL level. Output signal CE from inverter 3 is supplied to one of the two input terminals of NOR gate 4. The other input terminal of NOR gate 4 receives control signal CED to be described later with reference to FIG. 6 or 8. A threshold voltage of NOR gate 4 is set to be higher than that of inverter 3 so that logic "0" and "1" are correctly determined in accordance with an input signal of a CMOS level.

Output signal CE' from NOR gate 4 is supplied to internal circuit 5, and circuit 5 is activated or deactivated in accordance with signal $\overline{CE}'$. Circuit 5 comprises various circuits for executing the main functions of the semiconductor IC. For example, if the semiconductor IC is a RAM or a ROM, circuit 5 will include a memory cell array, a row address decoder, a column address decoder, a sense amplifier, a data output buffer, a timing generator for controlling operation timings of these circuits, and the like.

In the above arrangement, when predetermined time $T_{acs}$ has lapsed after chip enable signal $\overline{CE}$ falls and all output buffers formed in internal circuit 5 output "0" levels, large current Iss as shown in FIG. 2 instantaneously flows through the ground line. As a result, ground potential Vss varies as shown in FIG. 2. Since all circuits on a chip are connected to a pair of power source lines in a semiconductor IC, this power source noise is generated on the ground line connected to inverter 3 in which a low threshold voltage is set. When potential Vss is reduced below 0 V due to this power source noise, the threshold voltage of inverter 3 is reduced below a predetermined value accordingly. For this reason, even if chip enable signal $\overline{CE}$ is of a voltage which satisfies level "0", the voltage of signal $\overline{CE}$ is sometimes of a higher level than the threshold voltage of inverter 3. In this case, inverter 3 operates as if signal $\overline{CE}$ of level "1" has been supplied to its input terminal, and it erroneously outputs signal CE of level "0".

In the above embodiment, however, control signal CED which is at level "1" while the power source noise is being generated and which is at level "0" otherwise, is supplied to the other input terminal of NOR gate 4. Therefore, while signal CED is at level "1" i.e., while the power source noise is being generated, output signal CE' from NOR gate 4 can be set at a desired level, i.e., at an "0" level, regardless of signal CE. Therefore, in the arrangement of this embodiment, a signal of a desired level can be supplied to internal circuit 5 without being adversely affected by the power source noise, thereby preventing circuit 5 from erroneously operating.

FIG. 3 is a circuit diagram showing a second embodiment of the present invention which is obtained by logically converting the circuit shown in FIG. 1. In this embodiment, inverter 6, NAND gate 7, and inverter 8 are formed in place of NOR gate 4. Each of these elements has a threshold voltage adapted to an input signal of CMOS level. Therefore, when an input signal of CMOS level is supplied to the element, the logic level ("1" or "0" ) of the output signal of the element can be correctly determined in accordance with the input signal.

Output signal CE from inverter 3 is supplied to the input terminal of inverter 6. Output signal $\overline{CE}'$ from inverter 6 is supplied to one of the two input terminals of NAND gate 7. The other input terminal of NAND gate 7 receives an inverted CED signal, i.e., control signal $\overline{CED}$ which is at a "0" level while the power source noise is being generated and which is at a "1" level otherwise as described above. An output signal from NAND gate 7 is supplied to internal circuit 5 as signal CE" through inverter 8.

Also in this arrangement, control signal $\overline{CED}$ is only of a "0" level while the power source noise is being generated. Therefore, an erroneous operation of inverter 3 caused by the power source noise can be prevented from being transmitted to internal circuit 5, and signal $\overline{CE}''$ of a desired level can be supplied to circuit 5. Therefore, circuit 5 can be prevented from erroneously operating in response to the power source noise.

FIG. 4 shows a third embodiment of the present invention. In this embodiment, in order to reduce the number of gates, NAND gate 7' having two input terminals is arranged such that one input terminal of NAND gate 7' can receive an input voltage of a TTL level and another input terminal of NAND gate 7' can receive an input voltage of a CMOS level. Chip enable signal $\overline{CE}$ is externally supplied to one input terminal of NAND gate 7' through input terminal 1 and protection circuit 2, and control signal $\overline{CED}$ is supplied to the other input terminal of NAND gate 7'.

Figure 5:
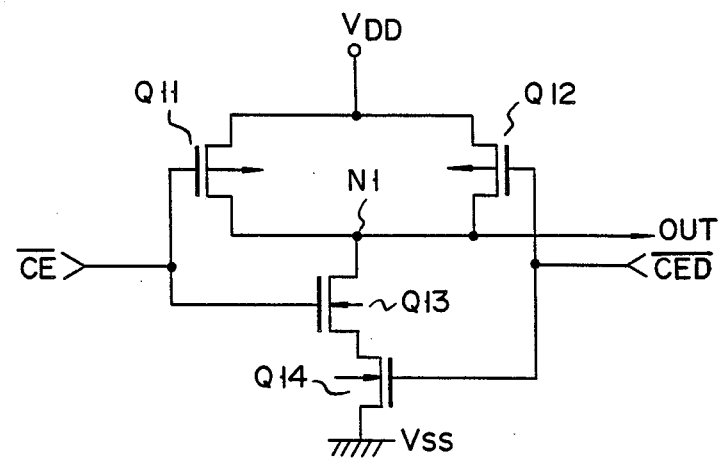
FIG. 5 is a circuit diagram showing a detailed arrangement of a logic gate formed in the semiconductor IC shown in FIG. 4.

FIG. 5 shows a detailed circuit arrangement of NAND gate 7'. NAND gate 7' comprises two p-type MOS transistors Q11 and Q12 and two n-type MOS transistors Q13 and Q14. Source-drain paths of transistors Q11 and Q12 are connected in parallel with each other between a power source potential VDD supply terminal and signal output node N1. Source-drain paths of transistors Q13 and Q14 are connected in series with each other between node N1 and a ground $V_{SS}$ terminal. Chip enable signal $\overline{CE}$ of a TTL level is supplied to the gates of transistors Q11 and Q13, and control signal $\overline{CED}$ of a CMOS level is supplied to the gates of transistors Q12 and Q14.

In transistors Q11 and Q13 having gates which receive signal $\overline{CE}$ of a TTL level, ratio W/L (channel width/channel length) of p-type MOS transistor Q11 is designed to be smaller than that of n-type MOS transistor Q13. In transistors Q12 and Q14 having gates which receive signal $\overline{CED}$ of a CMOS level, ratio W/L of p-type MOS transistor Q12 is designed to be larger than that of n-type MOS transistor Q14. In this embodiment, ratios W/L of transistors Q13 and Q14 are set to be equal to each other.

In NAND gate 7', transistor Q12 is turned on and transistor Q14 is turned off while control signal $\overline{CED}$ is of a "0" level. Therefore, a signal of a "1" level can be output from node N1, regardless of signal $\overline{CE}$ of a TTL level. Therefore, a smaller number of elements can prevent an erroneous operation of circuit 5 caused by the power source noise.

Figure 6:
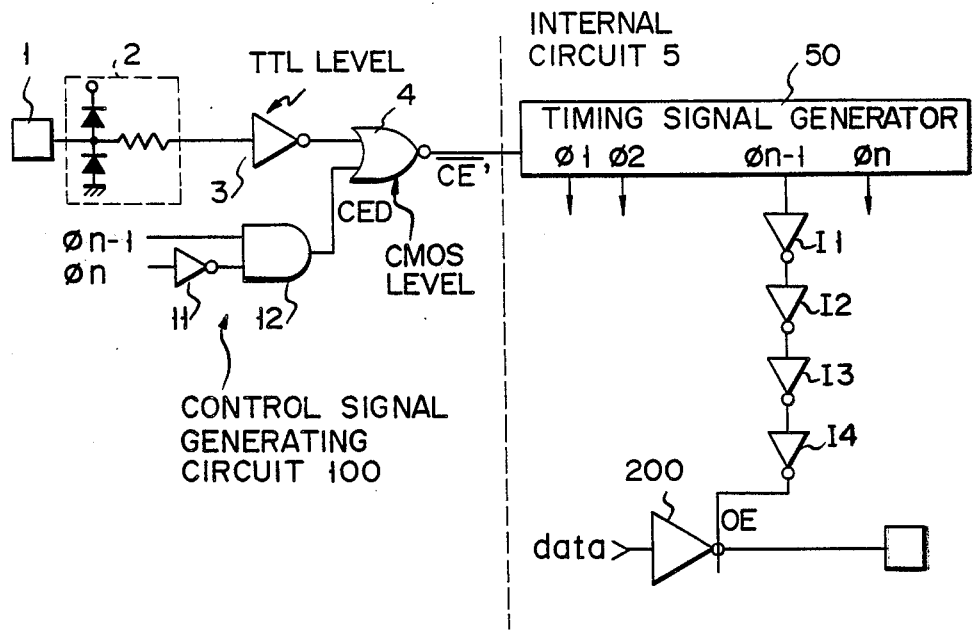
FIG. 6 is a circuit diagram showing a detailed arrangement of a control signal generating circuit for generating a control signal used in the semiconductor IC shown in FIG. 1.

FIG. 6 shows a detailed circuit arrangement of a control signal generating circuit for generating control signal CED used in the semiconductor IC shown in FIG. 1. Control signal generating circuit 100 generates signal CED utilizing an output from internal timing signal generator 50 formed in internal circuit 5.

Generator 50 receives output signal $\overline{CE}'$ from NOR gate 4 and sequentially delays the signal, thereby generating timing signals $\phi1$ to $\phi n$. Of these timing signals, $\phi n-1$ is delayed by a predetermined time interval through four series-connected inverters $I_1$ to $I_4$ and is supplied as output enable signal OE to data output buffer 200.

Circuit 100 includes inverter 11 and AND gate 12. One input terminal of AND gate 12 receives timing signal $\phi n-1$ supplied directly from generator 50, and its other input terminal receives timing signal $\phi n$ supplied from generator 50 through inverter 11. Signal $\phi n$ is obtained by delaying signal $\phi n-1$ by a predetermined time interval. An output from AND gate 12 is supplied to one input terminal of NOR gate 4 as control signal CED.

Figure 7:
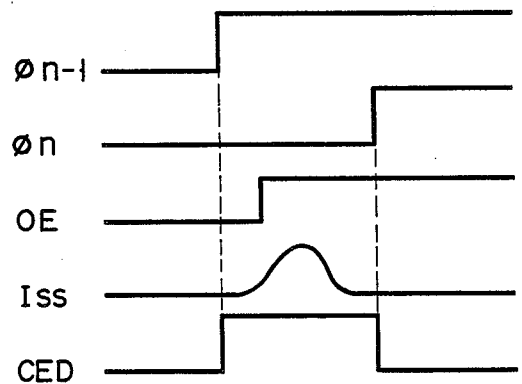
FIG. 7 is a timing chart for explaining an operation of the control signal generating circuit shown in FIG. 6.

Therefore, when the predetermined delay time obtained by four inverters $I_1$ to $I_4$ has lapsed after internal control signal $\phi n-1$ is generated, output enable signal OE rises from a "0" level to a "1" level, and data is output from output buffer 200. When the data output at this time is "0", current Iss flows through a ground line as shown in a timing chart of FIG. 7, and power source noise is generated.

AND gate 12 of circuit 100 outputs control signal CED which is of a "1" level during a period from a timing at which signal $\phi n-1$ rises from a "0" level to a "1" level to a timing at which $\phi n$ rises to a "1" level. For this reason, control signal CED rises to level "1" only for a time interval having a margin before and after a switching timing of an output state of buffer 200. Therefore, signal $\overline{CE}'$ is of a "0" level while the noise is being generated on the ground line, regardless of the output signal from inverter 3, thereby preventing an erroneous signal transmission to internal circuit 5. Protection circuit 2 in FIG. 6 comprises a resistor and diodes.

Figure 8:
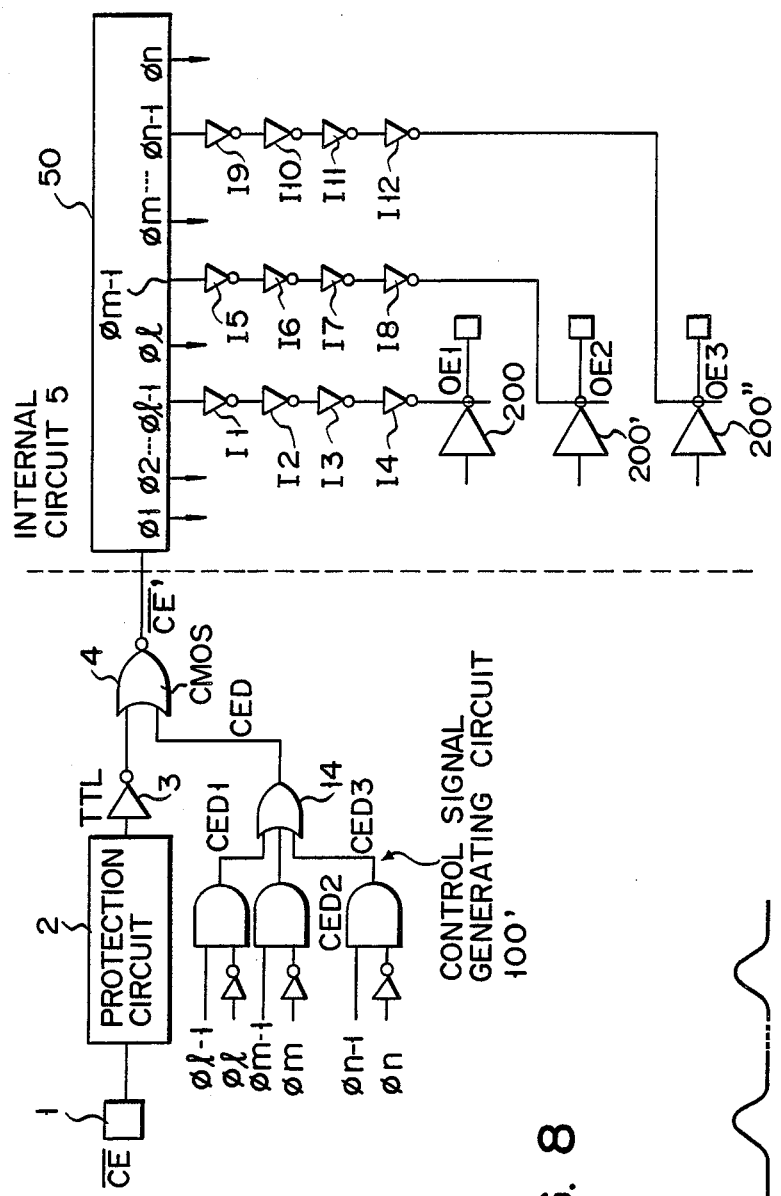
FIG. 8 is a circuit diagram showing another control signal generating circuit.

FIG. 8 shows another arrangement of the control signal generating circuit. In this arrangement, control signal CED is generated twice or more in consideration of the fact that power source noise is generated not only when an output from an output buffer is switched, but also when a high output load such as a word line is charged/discharged.

Figure 9:
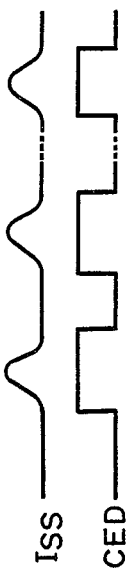
FIG. 9 is a timing chart for explaining an operation of the control signal generating circuit shown in FIG. 8.

That is, in this semiconductor IC, buffers 200, 200', and 200" are respectively activated by signals OE1, OE2, and OE3 respectively obtained by delaying control signals $\phi 1-1$, $\phi m-1$, $\phi n-1$ sequentially generated at delayed timings from internal timing signal generator 50 by a predetermined time interval by four inverters $I_1$ to $I_4$, $I_5$ to $I_8$, and $I_9$ to $I_{12}$. That is, buffers 200, 200', and 200" are respectively activated in synchronism with the leading edges of three output enable signals OE1, OE2, and OE3, and power source noise is generated each time the buffers are respectively activated. Therefore, in control signal generating circuit 100', control signals CED1, CED2, and CED3 each of which rises to a "1" level only during a time interval having a margin before and after a timing at which the power source noise is generated, are generated from inverters and AND gates as in the circuit shown in FIG. 6. Three input terminals of OR gate 14 receive the signals CED1, CED2, and CED3, and an output from OR gate 14 is used as control signal CED. As a result, as shown in FIG. 9, control signal CED can be generated each time power source noise is being generated.

What is claimed is:

1. A semiconductor integrated circuit comprising:
   a first logic circuit, having a first threshold voltage, for outputting a logic signal corresponding to a level of an input signal which is externally supplied thereto;
   a second logic circuit for outputting a logic signal of a predetermined level regardless of an output from said first logic circuit while a control signal is being generated, said second logic circuit having a second threshold voltage higher than the first threshold voltage, one input terminal for receiving an output signal of said first logic circuit, and another input terminal for receiving a control signal;
   an internal circuit for receiving the logic signal from said second logic circuit and executing a predetermined operation; and
   control signal generating means for generating the control signal while power source noise caused by the operation of said internal circuit is being generated.

2. A circuit according to claim 1, wherein said internal circuit includes an output buffer, and said control signal generating means generates the control signal for a predetermined time interval from a timing at which a level of an output signal from said output buffer changes.

3. A circuit according to claim 1, wherein said internal circuit includes an output buffer and a timing signal generator for generating a timing signal for switching said output buffer from an inactive to an active state, and said control signal generating means generates the control signal for a predetermined time interval from a timing at which the timing signal is generated.

4. A circuit according to claim 3, wherein the timing signal is supplied to said output buffer through a delay circuit, and said control signal generating means generates the control signal, in response to the timing signal, for a predetermined time interval from a timing at which the timing signal is generated.

5. A circuit according to claim 1, wherein said internal circuit includes a plurality of output buffers and a timing signal generator for generating a plurality of timing signals for sequentially switching said output buffers from an inactive to an active state, and said control signal generating means sequentially generates the control signals for predetermined time intervals from timings at which the timing signals are generated.

6. A circuit according to claim 1, wherein the threshold voltage of said first logic circuit is adapted to an input signal of a TTL level.

7. A circuit according to claim 1, wherein the threshold voltage of said second logic circuit is adapted to an input signal of a CMOS level.

8. A circuit according to claim 1, wherein said first logic circuit receives a chip enable signal for activating or deactivating said semiconductor integrated circuit 9. A circuit according to claim 1, wherein said first and second logic circuits comprise a third logic circuit, one input terminal of which receives the input signal, and the other input terminal of which receives the control signal.

10. A circuit according to claim 9, wherein said third logic circuit is a NAND gate, and said NAND gate comprises a power source potential supply terminal, a signal output node, a ground potential supply terminal, first and second p-type MOS transistors, current paths of which are connected in parallel with each other between said power source potential supply terminal and said signal output node, and third and fourth n-type MOS current paths of which are connected in series with each other between said signal output node and said ground potential supply terminal, the input signal being supplied to gates of said first and third transistors, and the control signal being supplied to gates of said second and fourth transistors.

11. A circuit according to claim 10, wherein a ratio of channel width/channel length of said first transistor is set to be smaller than a ratio of channel width/channel length of said third transistor, and a ratio of channel width/channel length of said second transistor is set to be larger than a ratio of channel width/channel length of said fourth transistor.

12. A circuit according to claim 11, wherein the ratio of channel width/channel length of said third transistor is set to be equal to the ratio of channel width/channel length of said fourth transistor.

13. A circuit according to claim 1, further comprising an input protection circuit which protects against an over-voltage, wherein the input signal is supplied to said first logic circuit through said input protection circuit.

14. A circuit according to claim 1, wherein said first logic circuit is an inverter, and said second logic circuit is a two-input NOR gate.

* * * * *